(12) United States Patent
Shieh et al.

(10) Patent No.: US 9,331,230 B2
(45) Date of Patent: May 3, 2016

(54) LED DIE DISPERSAL IN DISPLAYS AND LIGHT PANELS WITH PRESERVING NEIGHBORING RELATIONSHIP

(71) Applicants: Chan-Long Shieh, Paradise Valley, AZ (US); Gang Yu, Santa Barbara, CA (US)

(72) Inventors: Chan-Long Shieh, Paradise Valley, AZ (US); Gang Yu, Santa Barbara, CA (US)

(73) Assignee: CBRITE INC., Goleta, CA (US)

( * ) Notice: Subject to any disclaimer, the term of this patent is extended or adjusted under 35 U.S.C. 154(b) by 802 days.

(21) Appl. No.: 13/663,519

(22) Filed: Oct. 30, 2012

(65) Prior Publication Data
US 2014/0120640 A1    May 1, 2014

(51) Int. Cl.
*H05K 3/30* (2006.01)
*H01L 31/18* (2006.01)
*H01L 21/67* (2006.01)
*H01L 33/00* (2010.01)
*H01L 25/04* (2014.01)
*H01L 25/075* (2006.01)

(52) U.S. Cl.
CPC .......... *H01L 31/18* (2013.01); *H01L 21/67144* (2013.01); *H01L 25/042* (2013.01); *H01L 33/0095* (2013.01); *H01L 25/0753* (2013.01); *H01L 2224/83* (2013.01); *H01L 2224/95* (2013.01); *H01L 2924/0002* (2013.01); *Y10T 156/171* (2015.01)

(58) Field of Classification Search
CPC .................. H01L 21/67144; H01L 33/0095; H01L 33/30; H01L 25/042; Y10T 29/4913; Y10T 29/49124; Y10T 29/49128; Y10T 29/49133; Y10T 156/171
USPC ................ 29/832, 829, 825, 592.1, 833, 834; 156/378, 380.9, 542; 414/788, 922, 414/935, 936, 940
See application file for complete search history.

(56) References Cited

U.S. PATENT DOCUMENTS

| | | | | |
|---|---|---|---|---|
| 2002/0034860 A1* | 3/2002 | Miyamoto | ........... | G06K 19/077 438/464 |
| 2002/0064032 A1* | 5/2002 | Oohata | .................... | H04N 9/30 361/760 |
| 2006/0013680 A1* | 1/2006 | Haba | .................. | B23K 26/0846 414/800 |
| 2012/0292775 A1* | 11/2012 | Nakamura | .............. | H01L 24/29 257/773 |

* cited by examiner

*Primary Examiner* — Peter DungBa Vo
*Assistant Examiner* — Azm Parvez
(74) *Attorney, Agent, or Firm* — Robert A. Parsons; Michael W. Goltry; Parsons & Goltry

(57) ABSTRACT

A method of dispersing semiconductor chips from a wafer of semiconductor chips onto a substrate while preserving the neighboring relationship of each chip to each adjacent chip is disclosed. The method includes dispersing the wafer into sequential columns of semiconductor chips with a first pitch between columns while preserving the neighboring relationship and sequentially dispersing the columns of semiconductor chips into rows of individual chips with a second pitch between rows onto a substrate while preserving the neighboring relationship.

13 Claims, 9 Drawing Sheets

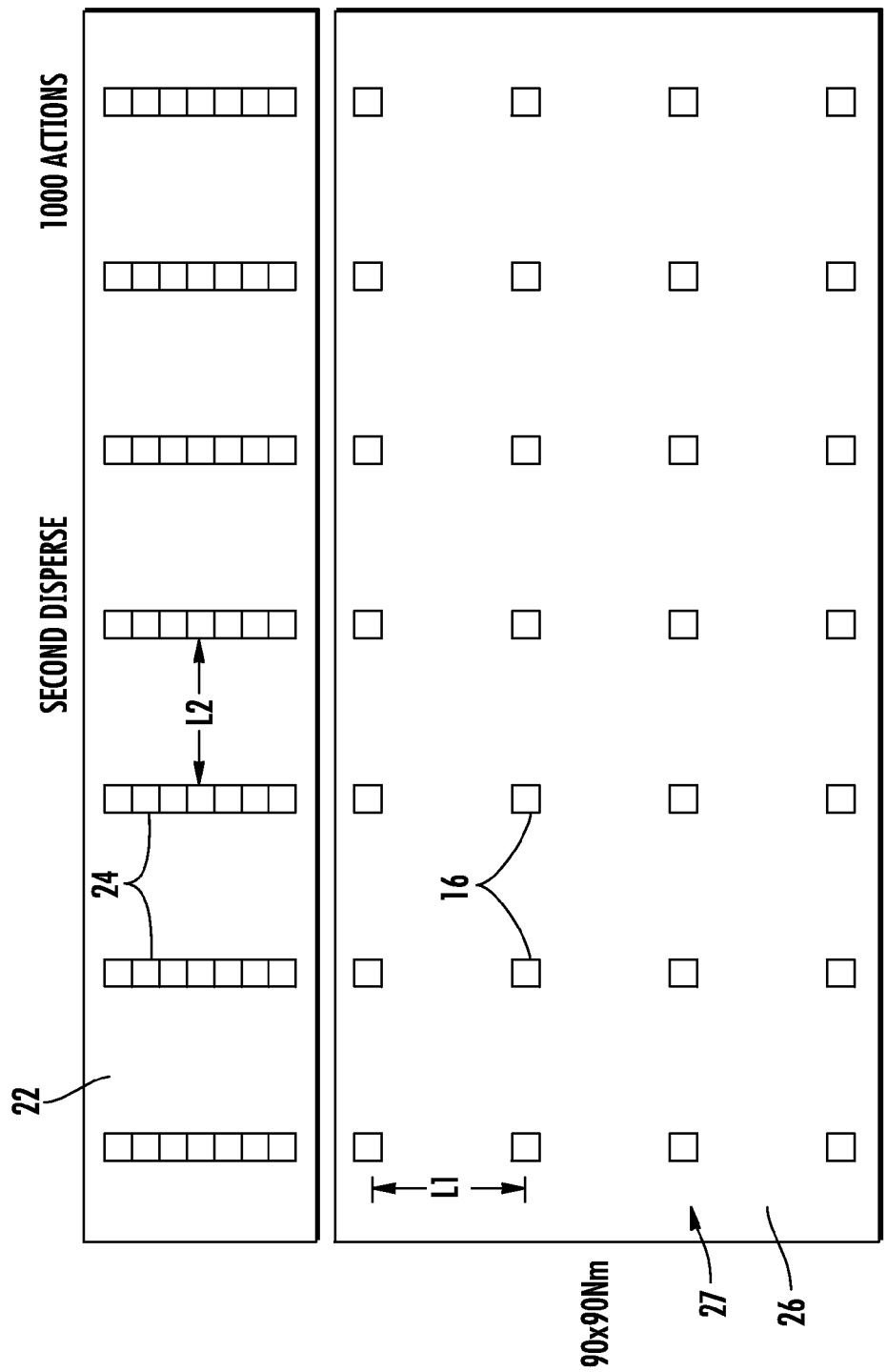

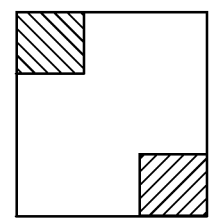
VIEW FROM
ELECTRODE SIDE
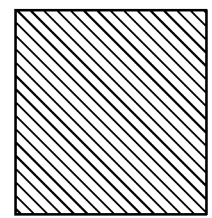
BOTTOM
VIEW
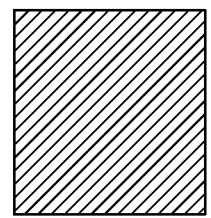
TOP
VIEW
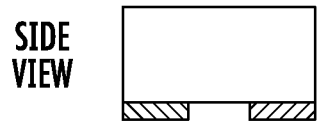
SIDE
VIEW
(A)
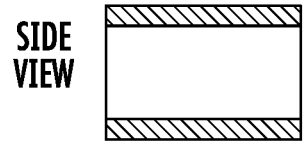
SIDE
VIEW
(B)
*FIG. 3A*

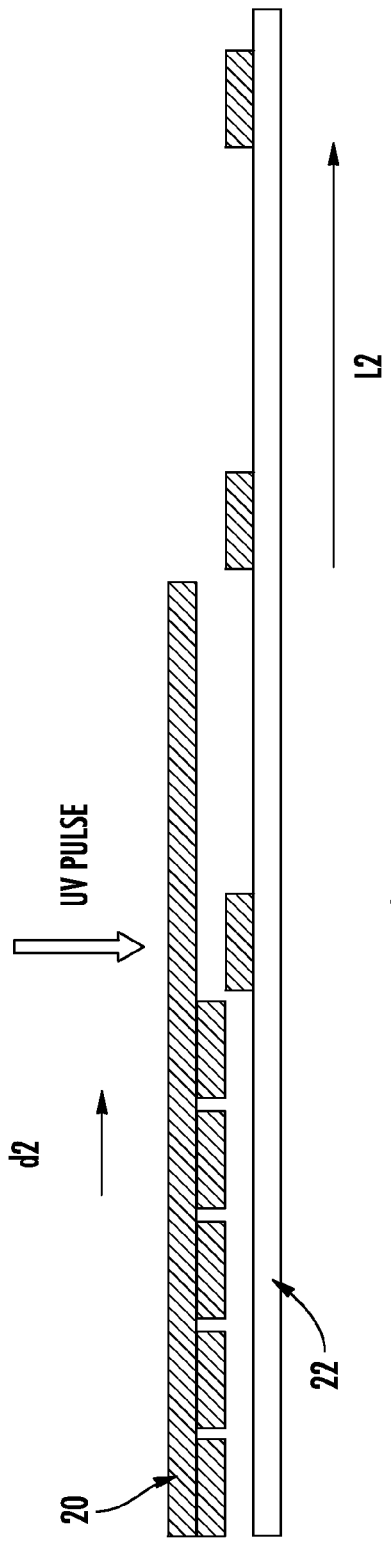
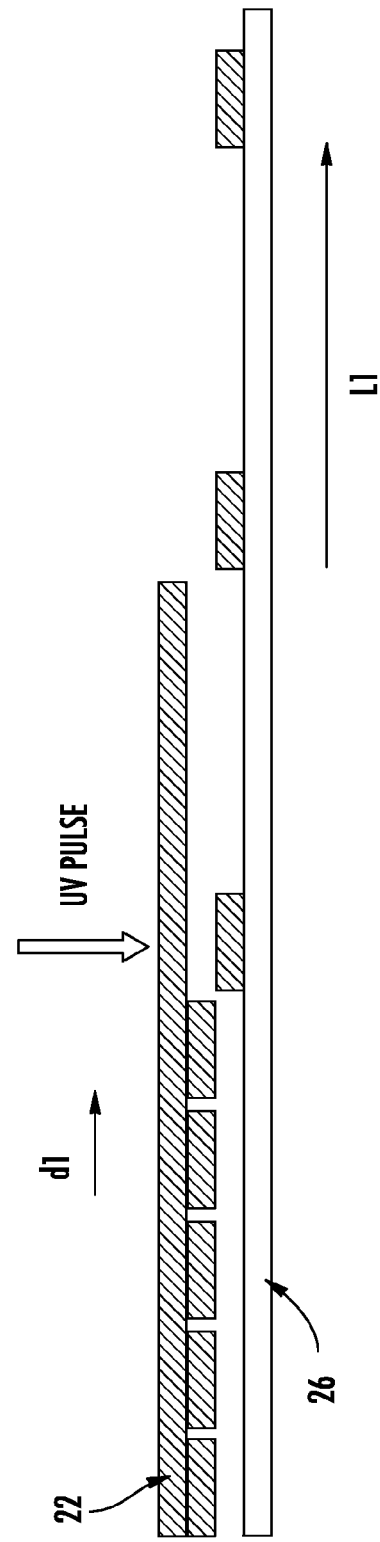

LED DIE DISPERSAL IN DISPLAYS AND LIGHT PANELS WITH PRESERVING NEIGHBORING RELATIONSHIP

FIELD OF THE INVENTION

This invention generally relates to the dispersal of LED dies in displays or light panels and more specifically to the preservation of a neighboring relationship.

BACKGROUND OF THE INVENTION

The efficiency of semiconductor light emitting diodes (LEDs) is improving rapidly and has become the ideal source for efficient displays that are capable of outdoor, public buildings or sport arenas viewing under relatively high ambient light. For example, gallium nitride (GaN) LEDs have improved to the capability of emitting up to 150 lm/W. But a GaN wafer to build LED display is too expensive because the cost per unit area is too high. On the other hand, the brightness of a GaN LED can be driven to a level that is more than $10^3$-$10^4$ times the needed brightness for outdoor display board or indoor TV screen. One idea is to use small GaN LED chips as the light generating elements and to place small chips on a large pitch to create a large size display with thin thickness profile. Further, by using smaller chips, the cost of the display is substantially lowered. The dilution factor (area of a pixel/area of GaN LED chip) can be larger than 1000 even for outdoor viewing purposes. This is possible because, with proper design and process, GaN LEDs can be made efficient even for die as small as 10 µm.

There have been large size display boards constructed with LED tiles/modules. Each LED tile/module comprises LED elements typically in format of 8×8, 16×16, 32×32. The LED elements on each tile are connected in so-called passive matrix array form with each LED mounted at the cross-point of each row and column electrode bus line. A large-size display board is formed with typically $10^2$-$10^3$ pieces of such tiles. One limiting factor of such display is the cost per area due to related driving circuit and components used. Another limiting cost factor is related with the conventional picking and place manufacture method of placing the LED (typically in surface mounting package) on the tile substrate (typically a printed circuit board, PCB). Because of these limiting factors, such displays have only been used in public areas (such as sport arena or outer wall of commercial buildings in central cities) for advertisement purpose.

However, one major problem in such display board is its related poor uniformity. This is due to the human eye can detect a small difference in brightness or colorimeter between adjacent or neighboring pixels. A substantial difference in brightness and color of emitted light can exist between chips selected from different areas of a common chip or from different chips. This effect can be easily seen in current LED display boards compiled with passive matrix LED tiles, especially in images with multiple gray levels. The LED display elements in a given passive matrix tile, and among different tiles were assembled without preserving neighborhood relationship on the original wafer. Therefore, it is important to preserve the relative positions of the chips as they were positioned on the wafer when originally manufactured, i.e. the preservation of a "neighboring relationship". Also, using standard pick-and-place methods and apparatus, LED chips are transferred from a wafer to a substrate one chip at a time. Thus, transferring large numbers of chips (e.g. 1000×1000) onto a display substrate requires 1 million steps. This process is extremely time consuming and costly with existing picking and placing process tools. A state-of-the-art automatic picking-and-placing tool can transfer $10^3$-$10^4$ chips per hour. The smallest chip size in surface mounting package is 100 um×100 um, within surface mounting package size of 600 um×300 um. The typical pitch on the passive LED tiles is in range of 3 mm to 10 mm.

It would be highly advantageous, therefore, to remedy the foregoing and other deficiencies inherent in the prior art.

Accordingly, it is an object of the present invention to provide new and improved methods of dispersing semiconductor chips.

It is another object of the present invention to provide new and improved methods of dispersing semiconductor chips that preserves the neighboring relationship.

It is another object of the present invention to provide new and improved methods of dispersing LED chips into an array with preset geometric parameters while preserving the original chip order or neighboring relationship.

It is another object of the present invention to provide new and improved methods of dispersing multiple semiconductor chips at a given process time (i.e., parallel transfer process) that a LED display or light board can be made with fewer steps, more cost efficiently and time efficiently.

It is another object of the present invention to provide new and improved methods of making display/light board with higher chip counts, small pixel pitch onto single supporting substrates.

It is another object of the present invention to provide new and improved apparatus for dispersing semiconductor chips that preserves the neighboring relationship.

It is another object of the present invention to provide new and improved apparatus for dispersing LED chips into an array with preset geometric parameters while preserving the original chip order or neighboring relationship.

It is another object of the present invention to provide a new type of display and light panels with large area/thickness ratio of which the emitting elements are made of small size LED chips and are dispersed over large area.

SUMMARY OF THE INVENTION

The desired objects of the instant invention are achieved in accordance with an embodiment a method of dispersing semiconductor chips from a wafer of semiconductor chips onto a substrate while preserving the neighboring relationship of each chip to each adjacent chip. The method includes dispersing the wafer into sequential columns of semiconductor chips with a first pitch between columns while preserving the neighboring relationship and sequentially dispersing the columns of semiconductor chips into rows of individual chips with a second pitch between rows onto a substrate while preserving the neighboring relationship.

The desired objects of the instant invention are further achieved in accordance with a specific method of dispersing semiconductor chips from a wafer of semiconductor chips onto a substrate while preserving the neighboring relationship of each chip to each adjacent chip. The specific method includes providing a wafer cut into individual chips in m columns and n rows, and releasably adhering the wafer on a first carrier and providing an intermediate carrier and placing a layer of releasable adhesive thereon. The method also includes the steps of dispersing the wafer from the first carrier into sequential columns of semiconductor chips with a first pitch between columns to the intermediate carrier while preserving the neighboring relationship, and releasing each sequential column from the first carrier and adhering each released column to the intermediate carrier with the layer of releasable adhesive as each column is dispersed from the first carrier to the intermediate carrier. The method further includes the steps of providing a substrate and sequentially dispersing the columns of semiconductor chips from the intermediate carrier into rows of individual chips with a second pitch between rows to the substrate while preserving the neighboring relationship, and releasing each sequential row of individual chips from the intermediate carrier as each row of individual chips is dispersed from the intermediate carrier to the substrate.

The desired objects of the instant invention are also achieved in accordance with a specific embodiment thereof wherein apparatus designed to disperse semiconductor chips from a wafer of semiconductor chips onto a substrate while preserving the neighboring relationship of each chip to each adjacent chip. The apparatus includes a movably mounted first carrier with a layer of releasable adhesive deposited thereon and having a wafer cut into individual chips in m columns and n rows releasably adhered thereon, a movably mounted intermediate carrier with a layer of releasable adhesive deposited thereon, a first element mounted for movement in synchronism with the movably mounted first carrier and the movably mounted intermediate carrier, and first release apparatus positioned to release each sequential column from the first carrier. The first element is designed and positioned so that movement of the first element provides pressure between released sequential columns of the wafer and the first carrier to disperse the sequential columns of semiconductor chips to the intermediate carrier with a first pitch between columns while preserving the neighboring relationship, each released column being adhered to the intermediate carrier with the layer of releasable adhesive as each column is dispersed from the first carrier to the intermediate carrier, A second element is mounted for movement in synchronism with the movably mounted intermediate carrier and a movably mounted substrate and second release apparatus is positioned to release each sequential row from the intermediate carrier. The second element is designed and positioned so that movement of the second element provides pressure between the intermediate carrier and released sequential rows of the wafer to disperse the sequential rows of semiconductor chips to a substrate with a second pitch between rows while preserving the neighboring relationship.

The desired objects of the instant invention are further achieved in accordance with an embodiment of a method of forming display/light panels in thin profile with large area-to-thickness ratio with LED chips dispersed with the method disclosed herein. Replacing the LED chips with photodiode chips or other types of sensor element, large area image sensor array, radiation sensor array or other type of sensor arrays can also be formed with the chip dispersion method disclosed in the instant invention.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 3 is a diagram illustrating a second chip dispersal step in the method preserving the neighboring relationship, in accordance with the present invention;

FIG. 3A shows schematics of LED die chips with contact electrodes on one side (a) and on both sides (b);

FIG. 8 is a diagram illustrating a portion of third chip dispersal apparatus for performing the first chip dispersal step illustrated in FIG. 2; and FIG. 9 is a diagram illustrating another portion of the third chip dispersal apparatus for performing the second chip dispersal step illustrated in FIG. 3.

DETAILED DESCRIPTION OF THE DRAWINGS

Figure 1:
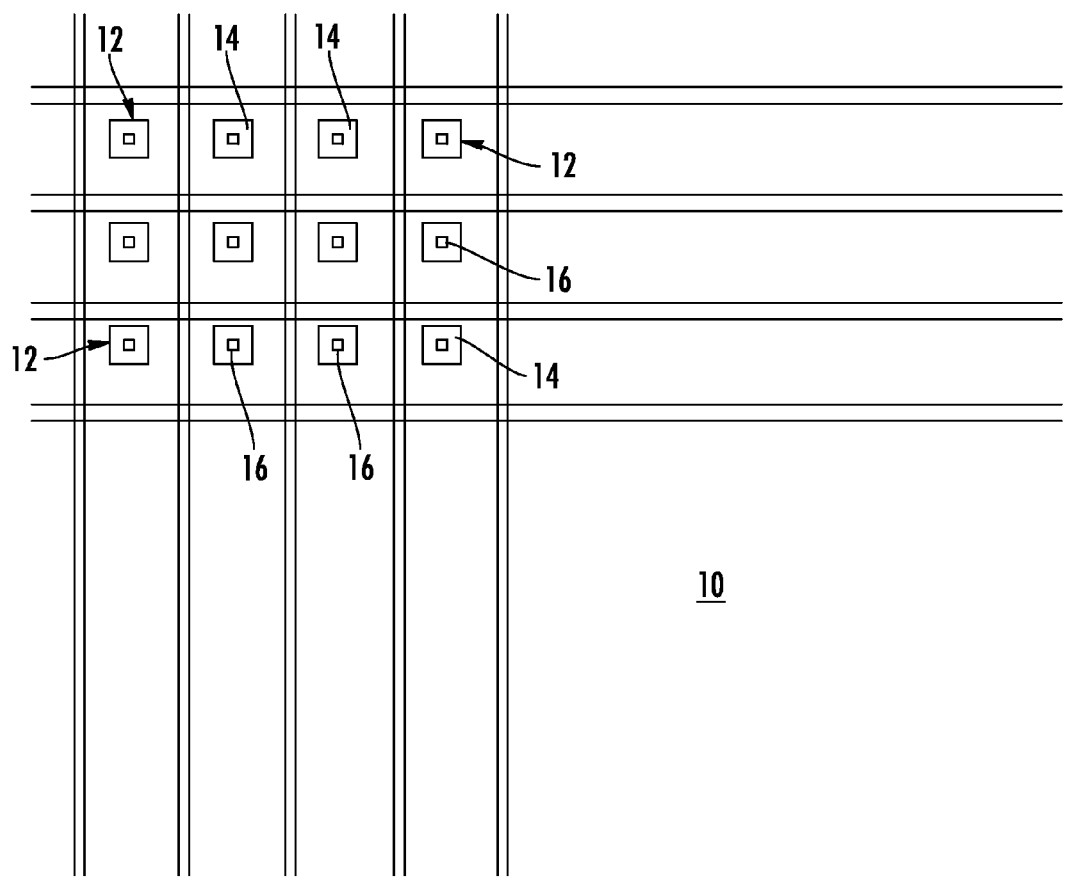
FIG. 1 is a top plan view of a substrate having LEDs mounted thereon in accordance with the present invention.

Referring specifically to FIG. 1, a substrate 10 is illustrated having LED die chips mounted thereon in accordance with the present invention. It will be understood that substrate 10 can be used for any of a large variety of light panels including a flat panel light source for general or special lighting (e.g. the thin backlight unit in an active matrix LCD display). Substrate 10 can also be formed as a passive matrix light emitting diode array where an LED die chip or die is placed at each junction of M rows of electrodes and N column of electrodes. In such a passive matrix light emission can be from either the bottom or the top or both sides. A full-color display can be formed using any of a variety of techniques including: red, green, and blue LED die chips distributed in a mosaic or stripe pattern; blue GaN die LEDs with green and red color formed by color conversion phosphors; and broad-band white LED chips with a set of red, green and blue color filters processed between the emitting LEDs and human eye. In addition to forming full-color emitter element with red, green and blue primary colors, additional emitters can be added for better color gamut, or for optimized display efficiency. For instance, in the full-color display made from a set of white LED die chips, an un-filtered LED die can be added in the color pixel to form red, green, blue and white sub-pixels. In any of these examples the basic structure will be referred to generically as a "substrate" and it is intended that the term "substrate" will incorporate any of these or any of the following examples.

An active matrix LED display can also be formed with the LED die chips dispersed to targeting locations on the substrate 10 with a pixel driving circuit underneath the dies. Such active matrix LED array allows integrating more display elements (typically beyond $10^3$) and enables a LED display be made onto a single substrate. In the processing of such an active matrix display, for example, a display of 1m×1n emitting elements in active area can be fabricated with 1000 LED dies in each row and a thousand rows or 1000 LED dies in each column. For purposes of this example, the die chips in FIG. 1 are designated 12 and only a few display elements are illustrated for convenience. As a further example, the space between each LED tile 12 is set at 1 mm, and the LED tile size is illustrated as a square with an area from 10 µm on a side to 900 µm on a side. When top emission (out of the surface in FIG. 1) is arranged, an optical reflector made of metal or conducting oxide stacks, designated 14, can be used as the bottom electrode of each LED die 16. Each display element 12 includes an LED die chip 16 mounted on the surface of each conducting reflector 14. Further, a specific embodiment will be used for purposes of explanation wherein each LED die chip 16 is 30 μm×30 μm. It should also be noted that each LED die chip 16 is or can be smaller than the associated metal reflector 14 on which it is mounted so that placement of LED die chip 16 on conducting reflector 14 is not a critical placement procedure, thus simplifying and making fabrication or assembly inexpensive. An optional extraction layer for efficiently coupling light out of LED chips 16 can be formed or deposited on top of the top electrode of each LED die chip 16. In practice the extraction layer can be combined with a color conversion or color filter layer or contrast enhancing layer formed by means of a printing or patterning process.

Figure 2:
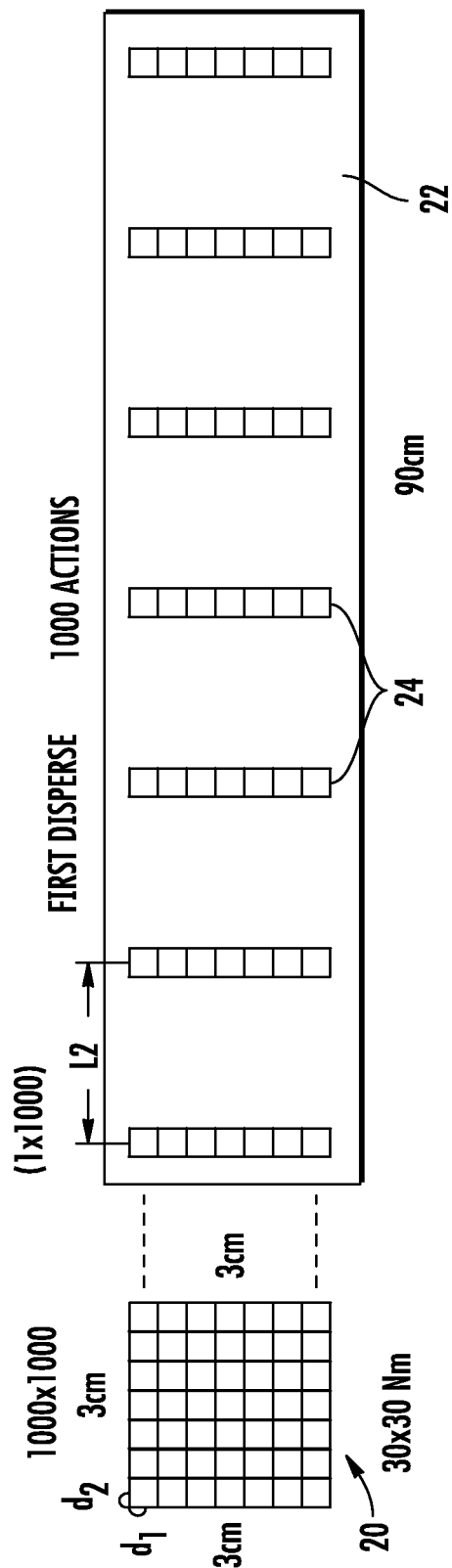
FIG. 2 is a diagram illustrating a first chip dispersal step in a method preserving the neighboring relationship, in accordance with the present invention.

Turning to FIG. 2, a semiconductor wafer 20 is illustrated consisting of m×n dies or chips each having a size of d1×d2. For convenience of understanding, this specific method and structure continues with the example of providing each LED chip 16 with a 30 μm×30 μm area. Wafer 20 can be separated into chips or dies 16 by etching or any other convenient well known method of cutting presently used in the art. The dies in wafer 20 are placed on a carrier with a UV-releasable adhesion layer. The UV-releasable adhesion layer is an adhesion/glue layer of which its adhesion strength can be greatly reduced under or after exposing to ultravioent (UV) light. Examples of such commercial products include UVF02809 or UVF02051 series UV release-able Varnish products by Ashland Inc. The adhesion coefficient can be reduced 10-50 times. For example, the adhesive strength is reduced from 5.0 (N/20 mm) to 0.1 (N/20 mm) after exposure to 365 nm UV dose of 150 mJ/cm$^2$. Each column 24 is released in its turn from the first carrier by UV illumination to that column. In the first dispersal illustrated in FIG. 2, dies 16 are transferred onto an intermediate carrier 22 coated with, for example, another UV release layer. The underlying mechanism of solid die transfer from one carrier to another is the difference of adhesion strengths between the two carriers. The die chip will stay with the carrier which possesses stronger surface adhesion. In the case of FIG. 2, chip die transfer from wafer 20 to intermediate carrier 22 can be achieved under the condition that adhesion strength of the receiving carrier is substantially higher than the adhesion of the releasing carrier. Even the same type of UV-release adhesion material could be used for both the receiving and releasing layers, reliable chip transfer can be achieved with a collimated UV light, wherein the collimated UV light is only illuminated onto the releasing layer on the wafer carrier. The adhesion layer under the die chip will not experience any UV light for the LED die chip is opaque to UV radiation.

The transfer is carried out in m steps with each step transferring a column 24 of n dies onto intermediate carrier 22. Specifically in a display including 1000×1000 tiles 12, wafer 20 will be 3 cm×3 cm, m will include 1000 die and n will include 1000 die. Thus, in the first dispersal illustrated in FIG. 2, 1000 steps are required to transfer 1000 columns 24, each including 1000 die, onto intermediate carrier 22. Further, adjacent columns 24 are placed on intermediate carrier 22 with a separation of a distance L2 or the structure has a pitch of L2.

Referring additionally to FIG. 3, a second dispersal is illustrated wherein dies 16 are transferred form intermediate carrier 22 to a final substrate 26. Final substrate 26 can be substrate 10 of FIG. 1 or another carrier ultimately used to transfer die 16 onto substrate 10 in a single operation. In this second dispersal, die 16 are released one at a time from each column 24 so that, in this specific example, a row 27 of 1000 die 16 are released and transferred to substrate 26 in each of n steps. Each row 27 of 1000 die 16 is separated from adjacent rows 27 on either side by a distance L1 or the structure has a pitch of L1. Thus, the relative positions of the chips as they were positioned on the wafer when originally manufactured, i.e. the preservation of a "neighboring relationship" is maintained.

In contrast to conventional picking-and-placing process for wafer transfer in which m×n chips are transferred in serial with m×n steps, only m steps are required to transfer all of m×n dies 16 from wafer 20 (in FIG. 2) onto intermediate carrier 22, and n steps from intermediate carrier 22 to final substrate 26 (FIG. 3); i.e., transfer of m×n dies are completed with m+n steps. In this specific example, the first carrier having wafer 20 releasably positioned by a UV release layer can be rigid and the final substrate 26 can be rigid but intermediate carrier 22 is preferably flexible or bendable. In fact, flexible or bendable materials can also be used for substrate 26. In such case, large size, flexible or conformable displays can be achieved.

In some cases, a soft or elastic layer on intermediate carrier 22 is preferred for optimizing transfer reliability (similar to the layer on a rubber stamp). In operation, flexible carrier 22 is pressured to contact rigid substrate 26 at some location (for example each row of tiles 12) and with the aid of a localized UV release mechanism. In this fashion, each row of die 16 is transferred from UV released intermediate carrier 22 to a row 27 of tiles 12 (for example) without a UV release mechanism. It will be noted that the top surface of dies 16 on substrate 26 is the same as the top surface of dies 16 on the first carrier (wafer 20) but dies 16 are dispersed with a pitch of L1×L2. Since die 16 has an area of d1×d2, the dilution factor is about (L1×L2)/(d1×d2). As explained above, the dilution factor can be as great as 9000 and it can be as little as 9, e.g. each die 16 spaced one die width or length from the next adjacent die.

While the manor of temporarily affixing the wafer to the first carrier and the columns of carriers to the intermediate carrier is described herein as using a UV release layer and UV illumination to provide the release, it will be understood that while this process is preferred for its simplicity and convenience of operation, other schemes may be used. For example some forms of pressure activated adhesive may be used in some applications or other light or heat activated materials may be incorporated. One specific example is a group of thermal releasable adhesion materials such as a group of organic materials known as wax or thermoplastic polymers. Their adhesion is high at room temperature, but can be reduced significantly at an elevated temperature. In this case, a light absorption layer can be constructed on the carriers 20 and 26. Under infrared or visible radiation at which the carrier surface possessing strong absorption, the temperature of the adhesion layer can be increased substantially at the targeting location, and the adhesion strength can be reduced substantially. The transfer is realized once the adhesion of the releasing layer is reduced to below that of the receiving layer. Other types of transfer mechanisms can also be used including those falling in a class of so-called laser transfer method known to the experts in printing industry. In addition to varying adhesion by light radiation, the yield of the transfer process can be improved by applying pressure between the releasing carrier and receiving carrier.

In addition to the UV releasable adhesive for binding the wafer to a carrier, UV-releasable tapes can also be used of which a glue layer and a release liner are often inserted in between the wafer and carrier tape. Such tapes have been used in wafer dicing process to hold the chips from flying away from the carrier. Examples of such tapes include Urukawa Electric's SP-Series and UC-Series, and Semiconductor Tapes and Materials' DT-UV-211 and DT-UV214A. Under UV radiation onto the releasing liner from back of the carrier 10, the adhesion strength can be reduced for 10-500 times and the die transfer can be achieved effectively when the adhesion from the carrier 10 to the intermediate carrier 22.

In all such procedures it is desirable that the adhesive can be easily cleaned from the surface and especially the surface of the LED from which light is emitted. This can be done with standard cleaning procedures available in cleanrooms, such as UV ozone or oxygen plasma treatment or wet soaking/jetting with organic solvents and DI water.

After each LED die or chip 16 is placed on a tile 12 of substrate 10 (substrate 26 in the example of FIG. 3), interconnection of the chips is required. In one specific example, substrate 10 is transparent (e.g. glass, plastic, etc.) and tiles 12, which are electrical connection pads, are transparent. The bottom side of each tile 12 (and therefore chip 16) is electrically connected to one of the row or column electrical lines on substrate 10 in a well-known manner. Each LED chip or die 16 has two surfaces, one of the surfaces is opaque and the other surface is transparent to emission wavelength in the visible spectral range. The entire LED die is opaque to UV radiation. A "planarization layer" can be filled between neighbor dies to the upper level of the m×n pieces of die chip array. In one specific process the entire substrate 10 is coated with a negative working insulating photopolymer with one of printing methods known to printing industry (such as slot coating, bar coating, screen printing, spray coating etc.), and dried. It is also preferable to use a photoresist cross-linkable under an elevated temperature. Examples of such materials include those categorized as epoxy and liquid glasses Exposure of the photopolymer is carried out through the back of transparent substrate 10. Since LED chips 16 are not transparent, only the polymer covering the top surface of LED dies is not exposed. The photopolymer is then developed and the top surface of each LED chip 16 is exposed with the insulating photopolymer remaining between LED chips 16. Surface planarization is sometimes preferred which can be done by polishing with proper chemicals or by simple reflow (heating the substrate 10 over glass temperature of the developed polymer. In addition to photolithography process, a planarized insulator layer filling up the space among the die-chip array can also be achieved by simple slot coating, screen printing, die-coating with the top surface of die chips primed un-wettable to the filler solution. A common top conducting layer is then deposited or coated/printed in contact with the top surface of each LED chip 16. If the light emission is to be from the top surface of substrate 10, the top surface of each LED chip 16 includes the transparent electrode and the common top conducting layer is transparent. If the light emission is to be from the bottom surface of substrate 10, the bottom surface of each LED chip 16 includes the transparent electrode and the common top conducting layer can be opaque. In special cases, light emission from both top and bottom surfaces can also be achieved.

In addition to a common top electrode, the surface electrode can also be patterned by means of standard photolithography or a printing method for special applications. For example, conducting busline patterns are needed for the top electrode pattern in a passive matrix light emitting diode array which can be done by patterning a continuous metal sheet by standard photolithography, or by printing silver or gold metal lines by means of ink dispensing.

A passivation layer can be placed or coated on the top electrode layer in the final product to meet the specifications on storage and operation lifetime.

In the method described above, LED dies with one electrode on each side are used (see FIG. 3A). In practice, die chips with a contact electrode on one side (either bottom or top) can also be processed in a similar method. The dispersion method described preserves the neighborhood relationship on the original wafer, and the methods of making for either the bottom and top electrodes are both patternable. One preferred arrangement for active matrix light emitting displays is to contact a pixel driving circuit on the substrate 26 with a thin-film transistor technology (with either poly-silicon or metal-oxide based channel layer) practice. One can then distribute the LED die chips with both anode and cathode on substrate 26 side, or with one of the electrode on bottom carrier 26 and the other facing the top.

Figure 4:
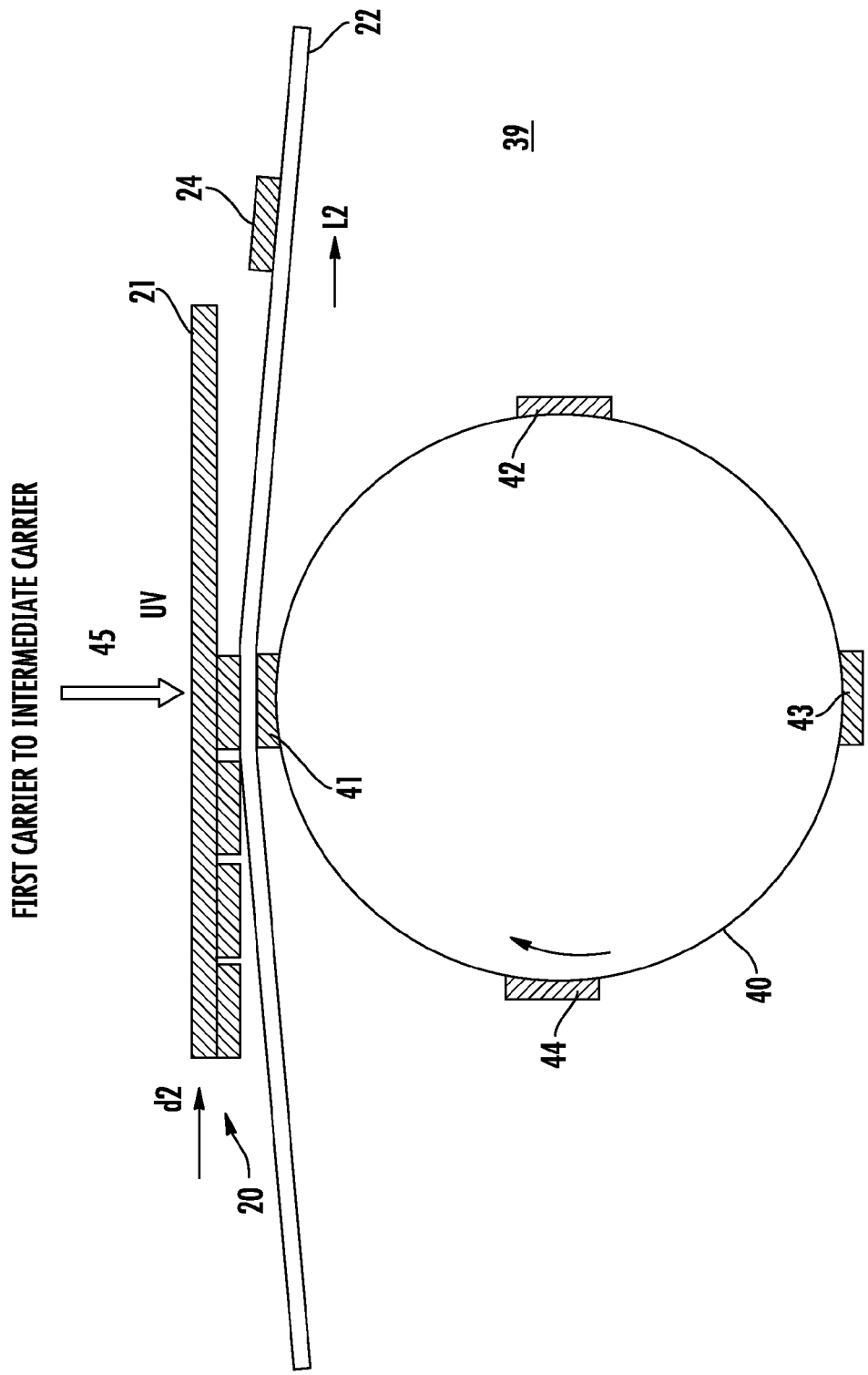
FIG. 4 is a diagram illustrating a portion of first chip dispersal apparatus for performing the first chip dispersal step illustrated in FIG. 2.
Figure 5:
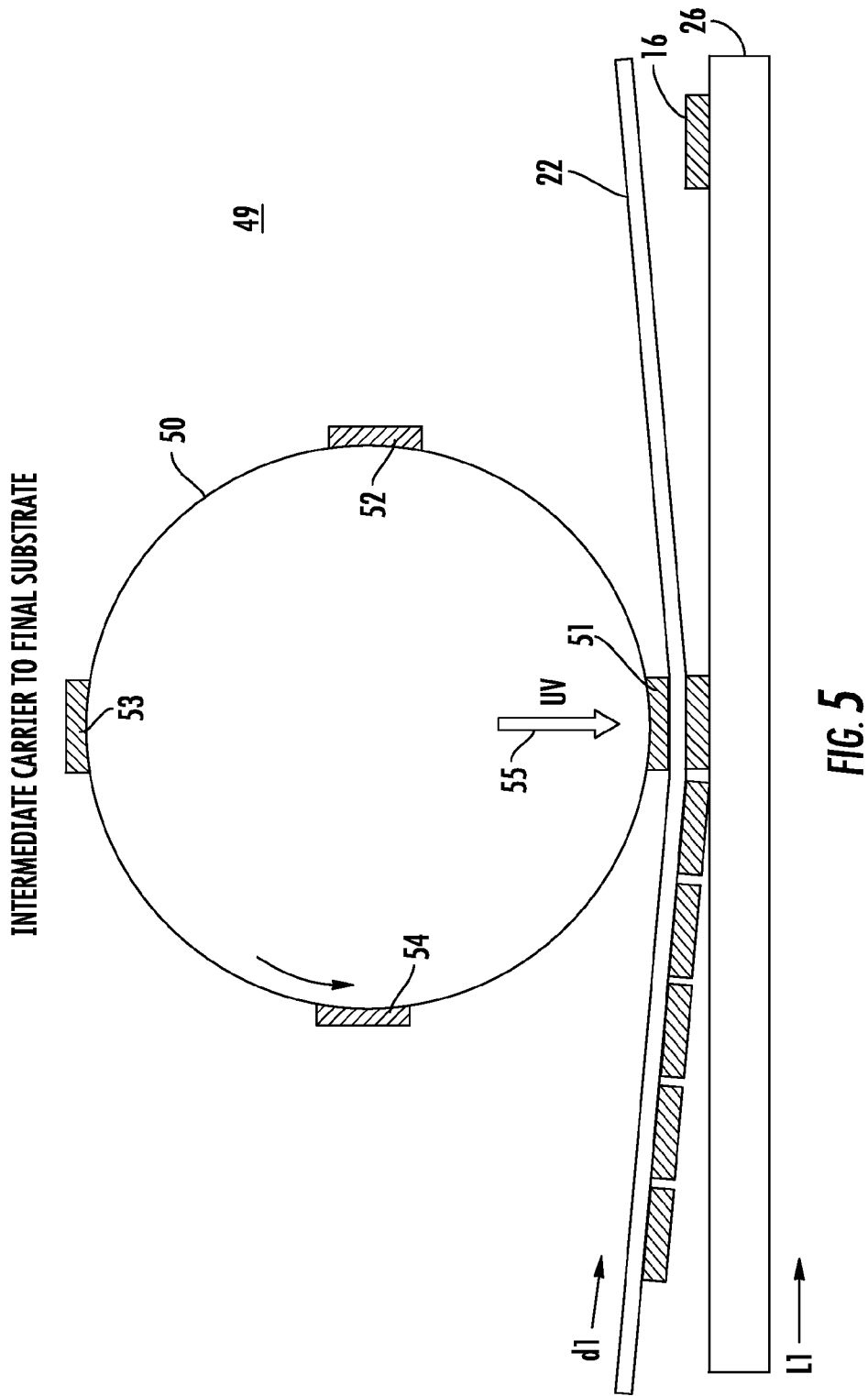
FIG. 5 is a diagram illustrating another portion of the first chip dispersal apparatus for performing the second chip dispersal step illustrated in FIG. 3.

Turning now to FIGS. 4 and 5 one example of apparatus that performs the above method is illustrated. Apparatus generally designated 39 in FIG. 4 disperses columns 24 of chips from wafer 20 onto intermediate carrier 22 and apparatus generally designated 49 in FIG. 5 disperses rows 27 of chips 16 from intermediate carrier 22 onto substrate 26.

Referring specifically to FIG. 4, a first element which in this embodiment is a roller 40 is illustrated with pressure pads 41, 42, 43, and 44 at orthogonal points (i.e. 0°, 90°, 180°, and 270°) around the periphery. Other designs with more pressure pads evenly or unevenly arranged around the periphery can also be used. Intermediate carrier 22 extends tangential to and in contact with the upper arc of roller 40. A wafer 20 on a first carrier 21 is positioned slightly above intermediate carrier 22 so as to be normally out of contact with intermediate carrier 22. Roller 40 has an axial length at least as long as a column 24 of LED die (see FIG. 2). Also, roller 40 and intermediate carrier 22 are driven (preferably from a common driver) to move together at a predetermined speed, i.e. the bottom surface of intermediate carrier 22 moves along the outer periphery of roller 40 at a common speed so that there is no relative movement therebetween. Further, first carrier 21 is driven (preferably synchronous with the movement of roller 40) to move to the right in FIG. 4 at a speed equal to the width (d2) of a column 24 of chips. Thus, as roller 40 rotates so that pressure pad 44 is in the illustrated position of pressure pad 41 (i.e. one quarter turn), intermediate carrier 22 moves to the right a distance equal to L2, and first carrier 21 moves to the right a distance equal to d2.

In operation, as roller 40 rotates clockwise and intermediate carrier 22 moves to the right, each of the pressure pads presses against the underside of intermediate carrier 22 in sequence so as to press the upper surface of intermediate carrier 22 against the surface of a column 24 of LED chips. Wafer 20 is releasably positioned on first carrier 21 by a UV release layer and the upper surface of intermediate carrier 22 has a UV releasable adhesive layer thereon. As each of the pressure pads rotates to the upper or 12-o-clock position (see pad 41 in FIG. 4) the upper surface of intermediate carrier 22 is forced into contact with a column 24 of LED chips. At this point a UV release mechanism, indicated by arrow 45, illuminates or causes the contacted column 24 to be released from first carrier 21 and to be adhered to the upper surface of intermediate carrier 22. UV release mechanism 45 does not affect the UV release layer on intermediate carrier 22 since the contacting column 24 blocks illumination of intermediate carrier 22. The rotation of roller 40, the movement of intermediate carrier 22, and the movement of first carrier 21 are designed and/or selected to sequentially position columns 24 on intermediate carrier 22 at a spacing of L2 (as described in conjunction with FIG. 2).

The surface of the pressure pad 41, 42 43 and 44 in FIG. 4 were sketched with flat surface. In practice, the surface profile and its elasticity can be varied as needed to optimize the die transfer. General design rules on these aspects are well known to experts in the field.

It will be understood that the position of first carrier 21 and wafer 20 in FIG. 4 is illustrated to provide a better understanding of the interrelationship of the various components and does not illustrate an accurate position relationship between intermediate carrier 22 and first carrier 21. In actual practice, columns 24 can be dispersed sequentially beginning from either the right hand edge or the left hand edge of first carrier 21 and ending at the opposite edge, i.e. the left hand edge or the right hand edge.

Referring specifically to FIG. 5, a second element which in this embodiment is a roller 50 is illustrated with pressure pads 51, 52, 53, and 54 at orthogonal points (i.e. 0°, 90°, 180°, and 270°) around the periphery. Other designs with more pressure pads evenly or unevenly arranged around the periphery can also be used. Intermediate carrier 22 extends tangential to and in contact with a lower arc of roller 50. Roller 50 has an axial length at least as long as a row 27 of LED die 16 (see FIG. 3). Also, roller 50 and intermediate carrier 22 are driven (preferably from a common driver) to move together at a predetermined speed. In this specific embodiment, intermediate carrier 22 is driven (preferably synchronous with the movement of roller 50) to move to the right in FIG. 5 at a speed equal to the length (d1) of a chip 16. Also, as intermediate carrier 22 moves a distance d1, substrate 26 moves to the right a distance L1 (the spacing between adjacent rows 27 of chips 16 (see FIG. 3). Thus, as roller 50 rotates so that pressure pad 54 is in the illustrated position of pressure pad 51 (i.e. one quarter turn), intermediate carrier 22 moves to the right a distance equal to d1, and substrate 26 moves to the right a distance equal to L1.

In operation, as roller 50 rotates counterclockwise and intermediate carrier 22 moves to the right, each of the pressure pads presses against the underside of intermediate carrier 22 in sequence so as to press the upper surface of chips 16 positioned on intermediate carrier 22 against the surface of substrate 26. As explained above, columns 24 are releasably positioned on intermediate carrier 22 by a UV release layer. As each of the pressure pads rotates to the lower or 6-o-clock position (see pad 51 in FIG. 5) the upper surface of intermediate carrier 22 is contacted forcing the next consecutive chip 16 in each column 24 into engagement with the surface of substrate 26 (or a tile 12 of substrate 10). At this point a UV release mechanism, indicated by arrow 55, illuminates or causes the contacted chips 16 to be released from intermediate carrier 22 and to be adhered to the upper surface of substrate 26. The rotation of roller 50, the movement of intermediate carrier 22, and the movement of substrate 26 are designed and/or selected to sequentially position chips 16 on substrate 26 at a spacing of L1 (as described in conjunction with FIG. 3).

It will be understood that the position of intermediate carrier 22 and substrate 26 in FIG. 5 is illustrated to provide a better understanding of the interrelationship of the various components and does not illustrate an accurate position relationship between intermediate carrier 22 and substrate 26. In actual practice, chips 16 will be dispersed from columns 24 sequentially beginning from the either the top or the bottom of intermediate carrier 22 and progressing to the opposite end (e.g. the bottom or the top). Also, while specific directions of movement have been assigned to the various components, it will be understood that different movements might be incorporated and the only requirement is that columns 24 are dispersed from wafer 20 in a regular sequence and chips 16 are dispersed from column 24 in a regular sequence so that the relative positions of the chips as they were positioned on the wafer when originally manufactured, i.e. the preservation of a "neighboring relationship" is maintained.

The carrier 26 can be either the final substrate for the display panel or a temporal carrier with die chip spread to that needed for the display pitch. In the first case, the needed adhesion can be achieved by UV curable conductive glue or adhesive coating, by solder pads similar to that used in ball grid array (BGA), by silver paste or by other means known to experts in the field.

Figure 6:
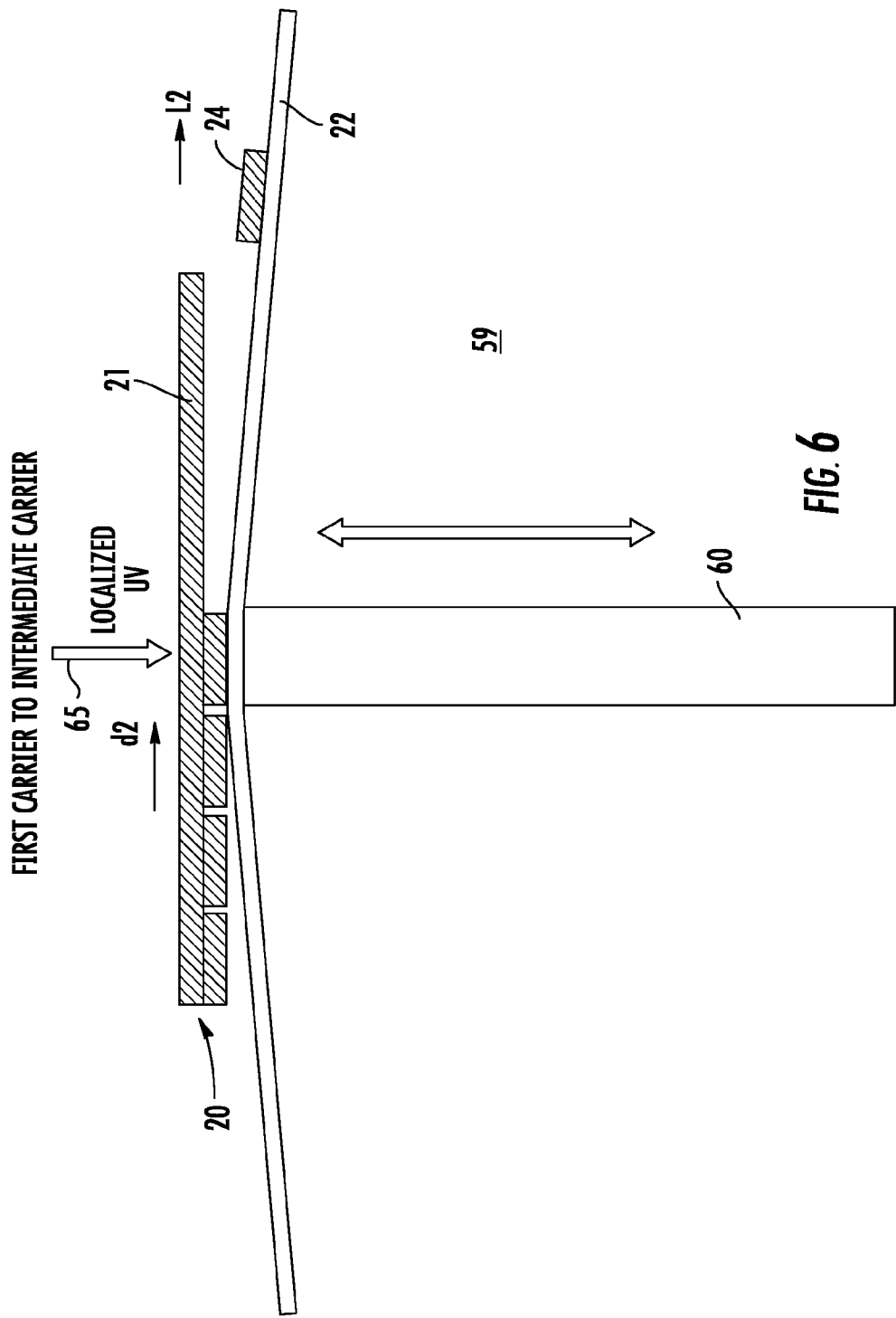
FIG. 6 is a diagram illustrating a portion of second chip dispersal apparatus for performing the first chip dispersal step illustrated in FIG. 2.
Figure 7:
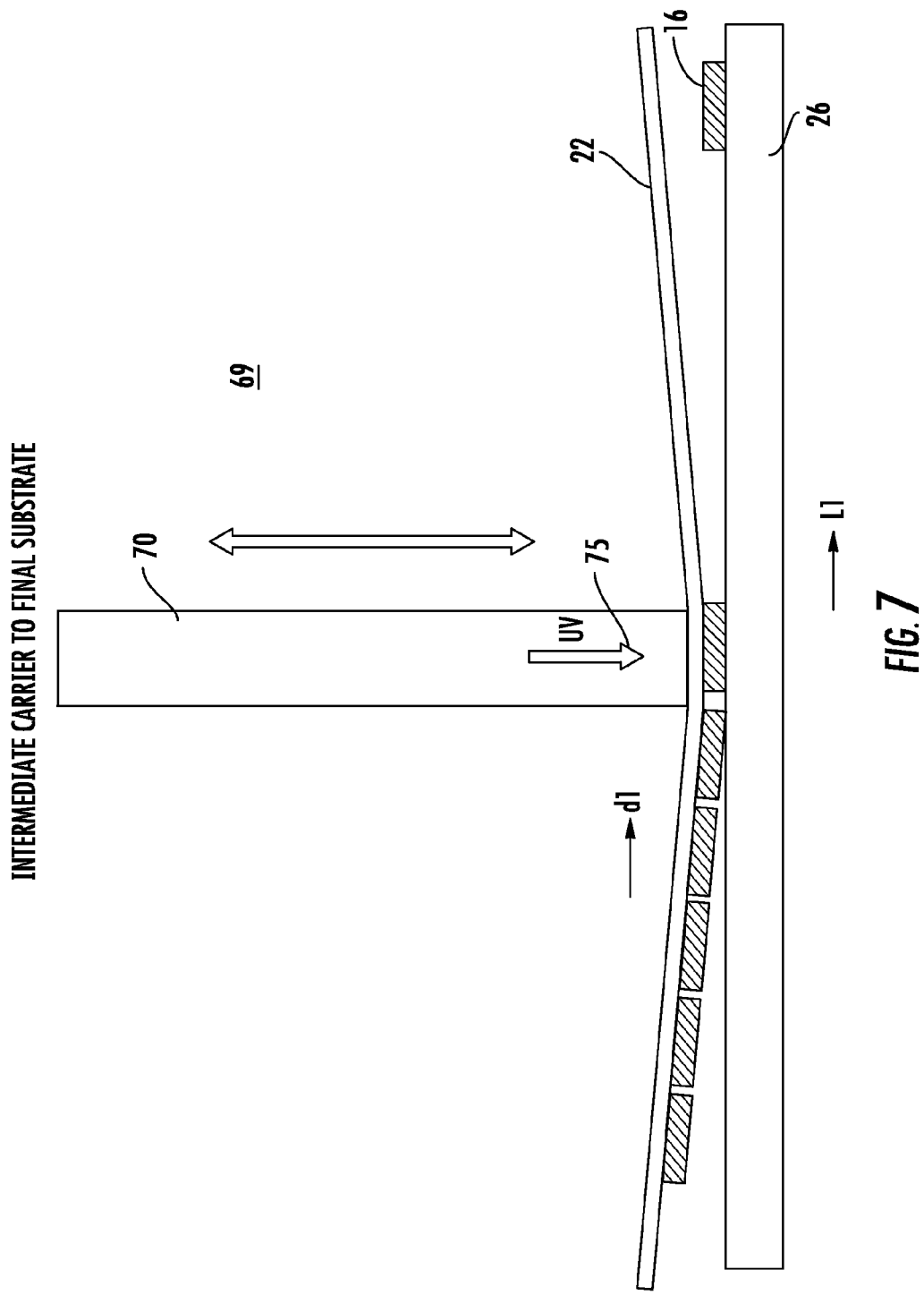
FIG. 7 is a diagram illustrating another portion of the second chip dispersal apparatus for performing the second chip dispersal step illustrated in FIG. 3.

Turning to FIGS. 6 and 7, another example of apparatus that performs the above method is illustrated. Apparatus generally designated 59 in FIG. 6 disperses columns 24 of chips from wafer 20 onto intermediate carrier 22 and apparatus generally designated 69 in FIG. 7 disperses rows 27 of chips 16 from intermediate carrier 22 onto substrate 26.

Referring specifically to FIG. 6, apparatus 59 operates substantially as described in conjunction with apparatus 39 in FIG. 4. The major difference is that roller 40 and the operation thereof is replaced by another first element which in this embodiment is a reciprocally mounted pressure column 60. Column 60 moves reciprocally (up and down) so that it sequentially provides pressure on intermediate carrier 22 and a complete column 24 in the same pattern as described in conjunction with pressure pads 41-44 on roller 40. As will be understood by the artisan, the movement of column 60 is synchronized to the movements of first carrier 21 and intermediate carrier 22 to sequentially disperse columns 24 of chips from wafer 20 onto intermediate carrier 22 as they were positioned on the wafer when originally manufactured, i.e. so that the preservation of a "neighboring relationship" is maintained.

Referring specifically to FIG. 7, apparatus 69 operates substantially as described in conjunction with apparatus 49 in FIG. 5. The major difference is that roller 50 and the operation thereof is replaced by another second element which in this embodiment is a reciprocally mounted pressure column 70. Column 70 moves reciprocally (up and down) so that it sequentially provides pressure on intermediate carrier 22 and a complete row 27 of chips 16 in the same pattern as described in conjunction with pressure pads 51-54 on roller 50. As will be understood by the artisan, the movement of column 70 is synchronized to the movements of intermediate carrier 22 and substrate 26 to sequentially disperse rows 27 of chips from intermediate carrier 22 onto substrate 26 as they were positioned on the wafer when originally manufactured, i.e. so that the preservation of a "neighboring relationship" is maintained.

Combination of the roller example in FIGS. 4 and 5 and the stamping example in FIGS. 6 and 7 can also be envisioned. In such case, the wafer carrier 20 in FIG. 4 can be tapped down (or roller 40 moving up) during the die transfer step. Similarly, the carrier 26 is moving up (or the roller 50 moving down) during die transfer process.

Another example of apparatus that performs the above method is illustrated in FIGS. 8 and 9. In addition to bendable plate/tape, a rigid plate can be used for the intermediate carrier 22. The releasing liner is made with a layer of an organo-metallic material with a low sublime temperature (typically in 100-300° C. range). During laser pulse illumination, the releasing layer absorbs the UV light causing the local temperature to rise above its sublime temperature (a temperature at which the material changes from solid phase into gaseous phase). The repulsion force created by the phase change pushes the die chip from flat carrier 20 to the carrier 22 nearby. Such types of laser induced micro-explosion effects are well known in scientific field [for example, L. S. Bennett, "Laser induced microexplosions of a photosensitive polymer", Applied Physics A 63, 327-332 (1996)]. Examples of sublime-able materials include a class of organic and organometallic molecules such as tris (8-hydroxyquinoline) aluminum (Alq) and Diindenoperylene ($C_{32}H_{16}$). The pressure force can be adjusted by laser intensity and duration, the thickness of the absorption layer, by laser wavelength and by environmental parameters nearby.

It will be understood that the position of first carrier 21 and wafer 20 in FIG. 6 and the position of intermediate carrier 22 and substrate 26 in FIG. 7 are illustrated to provide a better understanding of the interrelationship of the various components and does not illustrate an accurate position relationship between the components. As explained in detail above, in actual practice, columns 24 can be dispersed sequentially beginning from the either the right hand edge or the left hand edge of first carrier 21 and ending at the opposite edge, i.e. the right hand edge or the left hand edge. Also, in actual practice, chips 16 will be dispersed from columns 24 sequentially beginning from the either the top or the bottom of intermediate carrier 22 and progressing to the opposite end (e.g. the bottom or the top). It should be noted that in the above description elements 40, 50, 60, and 70 can be intermixed or replaced with other elements that are designed to provide the same function.

Thus in the above described method and in either of the specific apparatus described or in variations thereof, columns of chips are dispersed sequentially from a wafer so as to provide a specific pitch between columns and rows of individual chips are sequentially dispersed from the columns to provide a specific pitch between rows. The described method and apparatus disperses dies with a pitch of L1×L2 while preserving a "neighboring relationship". Further, since each die 16 has an area of d1×d2, the dilution factor is about (L1×L2)/(d1×d2).

The present invention provides new and improved methods of dispersing LED chips that preserves the neighboring relationship. The new and improved methods disperses LED chips into an array with preset geometric parameters while preserving the original chip order or neighboring relationship. Also, the new and improved methods of dispersing LED chips requires fewer steps and is therefore less costly and time consuming. The present invention also provides new and improved apparatus for dispersing LED chips into an array with preset geometric parameters while preserving the neighboring relationship.

In addition to being used for dispersing emitting elements in displays and light panels, other types of electronic array devices can be formed by replacing the LED die chips with die chips having special functions. For example, replacing the LED die chips with photovoltaic cell chips onto a substrate with an optical focusing lens array (processed by printing, molding, or other method before or after the chip transfer), large area solar cell panels can be achieved with better efficiency/cost figures. Moreover, replacing the LED die chips with photodetector chips, radiation detector chips, or other bands of electromagnetic spectral ranges, or die chips with other type of sensing functions, high pixel count, large area sensor arrays can be achieved with high near neighbor uniformity.

In addition to die chips spreading from wafer in d1×d2 area to L1×L2 area, the spreading with preserved neighboring relationship can be extended to any predefined spaces. For example with uneven patterns by arranging the corresponding press pads on the rollers 40 and 50.

By replacing a flat carrier 26 with a flexible or bendable substrate, displays in flexible or conformable forms can be achieved.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A method of dispersing semiconductor chips from a wafer of LED semiconductor chips each chip with a d1×d2 area, including m columns and n rows of semiconductor chips, onto a substrate while preserving the neighboring relationship of each chip to each adjacent chip, the method comprising the steps of:
   dispersing the wafer into sequential columns of semiconductor chips, including m sub-steps, with a first pitch L2 between columns while preserving the neighboring relationship;
   sequentially dispersing the columns of semiconductor chips into rows of individual chips, including n sub-steps, with a second pitch L1 between rows onto a substrate while preserving the neighboring relationship;
   the steps of dispersing the wafer into sequential columns and sequentially dispersing the columns of semiconductor chips into rows providing a dilution factor in a range of 9 to 9000.

2. A method as claimed in claim 1 wherein the wafer includes m columns and n rows of GaN LED semiconductor chips each chip having an area at least 10 µm by 10 µm, and the dilution factor being approximately 9000.

3. A method as claimed in claim 1 wherein the semiconductor die chips dispersed include one of light emitting elements of a flat panel light source, a backlight unit in an active matrix LCD display, a passive matrix light emitting diode array, and a component of a full-color, active matrix display.

4. A method as claimed in claim 1 wherein the semiconductor die chips dispersed include a sensing function and are being used as sensing elements of one of a photovoltaic solar cell panel, a light detector array, radiation detector array, a biosensor sensor array, or other type of sensor arrays.

5. A method of dispersing semiconductor chips from a wafer of semiconductor chips onto a substrate while preserving the neighboring relationship of each chip to each adjacent chip, the method comprising the steps of:
   providing a wafer cut into individual chips in m columns and n rows, and releasably adhering the wafer on a first carrier including using one of a UV releasable adhesive, a UV-releasable tape, a thermal transfer layer, or a laser induced sublimation transfer layer;
   providing an intermediate carrier and placing a layer of releasable adhesive thereon;
   dispersing the wafer from the first carrier into sequential columns of semiconductor chips with a first pitch between columns to the intermediate carrier while preserving the neighboring relationship, releasing each sequential column from the first carrier including illuminating each sequential column one column at a time with UV radiation, and adhering each released column to the intermediate carrier with the layer of releasable adhesive as each column is dispersed from the first carrier to the intermediate carrier;

providing a substrate; and sequentially dispersing the columns of semiconductor chips from the intermediate carrier into rows of individual chips with a second pitch between rows to the substrate while preserving the neighboring relationship, and releasing each sequential row of individual chips from the intermediate carrier as each row of individual chips is dispersed from the intermediate carrier to the substrate.

6. A method as claimed in claim 5 wherein the step of placing the layer of releasable adhesive on the intermediate carrier includes applying a UV releasable adhesive.

7. A method as claimed in claim 6 wherein the step of releasing each sequential row of individual chips from the intermediate carrier includes illuminating each sequential row of individual chips one row at a time with UV radiation.

8. A method as claimed in claim 5 wherein the steps of dispersing the wafer from the first carrier into sequential columns and sequentially dispersing the columns into rows of individual chips includes dispersing the wafer from the first carrier to the substrate with an upper surface of each chip in the wafer oriented as an upper surface of each chip on the substrate.

9. A method as claimed in claim 5 wherein the step of dispersing the wafer into sequential columns includes m sub-steps and the step of sequentially dispersing the columns of semiconductor chips into rows includes n sub-steps.

10. A method as claimed in claim 5 wherein the wafer includes m columns and n rows of LED semiconductor chips each chip with a d1×d2 area, the first pitch being L2, and the second pitch being L1, the steps of dispersing the wafer into sequential columns and sequentially dispersing the columns of semiconductor chips into rows providing a dilution factor in a range of 9 to 9000.

11. A method as claimed in claim 10 wherein the step of providing the substrate includes providing a substrate with contact pads thereon, each contact pad having an area larger than the area of each LED semiconductor chip, and the contact pads positioned in m columns and n rows with the first pitch L2 and the second pitch L1 therebetween, and the step of sequentially dispersing columns of semiconductor chips from the intermediate carrier into rows of individual chips to the substrate includes positioning the rows of individual chips on the rows of contact pads.

12. A method as claimed in claim 5 wherein the semiconductor die chips dispersed are light emitting elements of one of a flat panel light source, a backlight unit in an active matrix LCD display, a passive matrix light emitting diode array, and a full-color active matrix display.

13. A method as claimed in claim 5 wherein the semiconductor die chips dispersed are of a sensing function and are being used as sensing elements of one of a light detector array, radiation detector array, a biosensor sensor array, or other type of sensor arrays.

* * * * *